(12) United States Patent
King

(10) Patent No.: US 8,674,484 B2
(45) Date of Patent: Mar. 18, 2014

(54) DIELECTRIC SEPARATOR LAYER

(75) Inventor: Sean King, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 258 days.

(21) Appl. No.: 12/317,839

(22) Filed: Dec. 30, 2008

(65) Prior Publication Data

US 2010/0164074 A1 Jul. 1, 2010

(51) Int. Cl.
*H01L 23/58* (2006.01)
(52) U.S. Cl.
USPC ........... 257/635; 257/639; 257/774; 438/622; 438/624
(58) Field of Classification Search
USPC ........... 257/639, 744, 774, 784, 635; 438/30, 438/622, 624, 778
See application file for complete search history.

(56) References Cited

U.S. PATENT DOCUMENTS

| 5,462,636 | A | 10/1995 | Chen et al. |
| 6,436,808 | B1 * | 8/2002 | Ngo et al. ..................... 438/623 |
| 6,734,096 | B2 * | 5/2004 | Dalton et al. ................. 438/624 |
| 7,071,129 | B2 * | 7/2006 | Jan et al. ....................... 438/798 |
| 7,282,441 | B2 * | 10/2007 | Fuller et al. ................... 438/637 |
| 2003/0215970 | A1 * | 11/2003 | Yang et al. ...................... 438/30 |
| 2006/0024976 | A1 * | 2/2006 | Waldfried et al. ............ 438/778 |
| 2007/0052096 | A1 * | 3/2007 | Su et al. ........................ 257/744 |
| 2007/0222071 | A1 * | 9/2007 | Moon ........................... 257/736 |
| 2008/0054487 | A1 * | 3/2008 | Hsu et al. ...................... 257/774 |
| 2008/0173984 | A1 * | 7/2008 | Lin et al. ...................... 257/639 |
| 2008/0197513 | A1 * | 8/2008 | Restaino et al. .............. 257/784 |

* cited by examiner

*Primary Examiner* — Kimberly Rizkallah
*Assistant Examiner* — Errol Fernandes
(74) *Attorney, Agent, or Firm* — Winkle, PLLC

(57) ABSTRACT

The present invention describes a method including: providing a substrate; stacking interlevel dielectric layers over said substrate, and separating said interlevel dielectric layers with a dielectric separator layer.

5 Claims, 3 Drawing Sheets

DIELECTRIC SEPARATOR LAYER

BACKGROUND OF THE INVENTION

1. Field of the Invention

The present invention relates to a field of semiconductor integrated circuit (IC) manufacturing, and more specifically, to a dielectric separator layer to reduce electromigration and a method of making such a dielectric separator layer.

2. Discussion of Related Art

In 1965 Gordon Moore observed that the pace of technology innovation resulted in a doubling of a number of devices per unit area on an IC chip about every 18 months. Over the ensuing decades, the semiconductor industry has adhered closely to a schedule projected by Moore's Law for improving device density.

Maintaining such an aggressive schedule for each device generation has required continual enhancements at the corresponding technology node. Devices on a chip are fabricated from a semiconductor, such as silicon, that is isolated with an electrical insulator, such as silicon oxide. The devices are connected with an electrical conductor, such as copper, stacked in layers that are separated vertically and horizontally by the electrical insulator.

Additive processes, such as oxidation, deposition, and ion implantation have been improved to produce the requisite doping profiles and film stacks across the chip. Subtractive processes, such as wet etch, dry etch, and chemical-mechanical polish have also been improved to maintain pattern fidelity of the features across the chip.

Photolithography was enhanced to keep up with a reduction in the critical dimension (CD) needed for each device generation. However, improving the resolution that could be achieved often required compromising the depth of focus (DOF). As a result, the smaller DOF made it necessary to minimize the topography across the substrate in which the device was being formed. Thus, planarization of the surface of the substrate with chemical-mechanical polish (CMP) became necessary to fabricate advanced devices.

In order to improve device density, both the transistor in the front-end of semiconductor processing and the interconnect in the back-end of semiconductor processing have to be scaled down. The scaling of the transistor and the scaling of the interconnect must be carefully balanced to avoid degrading performance or reliability of the chip.

The switching speed of the transistor may be adversely impacted by an excessively large resistance-capacitance (RC) product delay in the interconnect. Resistance in the interconnect may be reduced by using an electrically conducting material with a low resistivity. Capacitance in the wiring may be reduced by using an electrically insulating material with a low dielectric constant (k).

However, the electrically insulating material with a low dielectric constant must also have high mechanical strength to withstand the rigors of front-end and back-end of semiconductor processing, as well as, the packaging steps.

Thus, what is needed is an electrically insulating material with low dielectric constant and high mechanical strength and a method of making such an electrically insulating material.

DETAILED DESCRIPTION OF THE PRESENT INVENTION

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

The present invention discloses a dielectric separator layer (DSL) between interlevel dielectric layers (ILD) and a method of making the dielectric separator layer.

In an embodiment of the present invention, the dielectric separator layer fills open pores in an underlying interlevel dielectric layer.

In an embodiment of the present invention, the dielectric separator layer stuffs grain boundaries in an underlying conductor or metal, such as in an inlaid interconnect.

In an embodiment of the present invention, the dielectric separator layer improves adhesion at an interface between vertically stacked interlevel dielectric layers. In an embodiment of the present invention, the dielectric separator layer improves adhesion at an interface between a metal, such as in an inlaid interconnect, and the surrounding interlevel dielectric layer for the same level.

In an embodiment of the present invention, the dielectric separator layer absorbs any net stress, whether compressive or tensile, generated at an interface between vertically stacked interlevel dielectric layers. In an embodiment of the present invention, the dielectric separator layer prevents delamination, peeling, or cracking at an interface between the metal and the surrounding interlevel dielectric layer for the same layer.

In an embodiment of the present invention, the dielectric separator layer prevents diffusion of water (moisture) at an interface between interlevel dielectric layers.

In an embodiment of the present invention, the dielectric separator layer prevents diffusion of ions, such as of sodium, at an interface between interlevel dielectric layers.

In an embodiment of the present invention, the dielectric separator layer prevents diffusion of atoms, such as of gold, at an interface between interlevel dielectric layers.

In an embodiment of the present invention, the dielectric separator layer prevents diffusion, intermixing, or reaction of a metal, such as from an inlaid interconnect, with the surrounding materials, such as the interlevel dielectric layers.

In an embodiment of the present invention, the dielectric separator layer reduces electromigration, such as of copper, at an interface between interlevel dielectric layers.

A method of forming the dielectric separator layer 115 over a device 95 is shown in FIGS. 1A-1I according to an embodiment of the present invention.

Figure 1A:
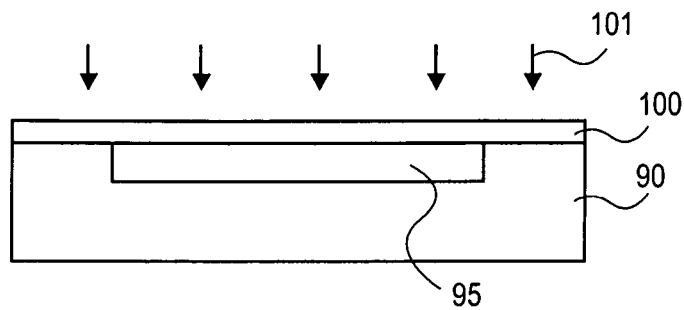
FIGS. 1A-1I are illustrations of a cross-sectional view of various embodiments of a method of forming a dielectric separator layer according to the present invention.

As shown in an embodiment of the present invention in FIG. 1A, the device 95 is formed in a substrate 90. In an embodiment of the present invention, the substrate 90 includes a semiconducting material, such as Silicon (Si), Germanium (Ge), Silicon-Germanium (SiGe), or Gallium Arsenide (GaAs).

In an embodiment of the present invention, the device 95 includes a bipolar junction transistor (BJT) where contact is made to a collector, a base, and an emitter. In an embodiment of the present invention, the device 95 includes a field effect transistor (FET) where contact is made to a source, a drain, and a gate.

In an embodiment of the present invention, the dielectric separator layer 115 is formed between the vertically stacked interlevel dielectric layers.

In an embodiment of the present invention, the dielectric separator layer 115 includes a bilayer formed from a lower layer 100 and an upper layer 104. In an embodiment of the present invention, the dielectric separator layer 115 includes a bilayer formed from a modified lower layer 102 and an upper layer 104.

First, a lower layer 100 is formed over the substrate 90 and the device 95.

In an embodiment of the present invention, the lower layer 100 is formed with chemical vapor deposition (CVD), plasma-enhanced CVD (PECVD), or high-density plasma CVD (HDPCVD).

In an embodiment of the present invention, the lower layer 100 is formed with atomic layer chemical vapor deposition (ALD) or plasma-enhanced ALD (PEALD).

In an embodiment of the present invention, the lower layer 100 is formed with physical vapor deposition (PVD), sputtering, ion beam deposition (IBD), or evaporation.

In an embodiment of the present invention, the lower layer 100 is formed with a coat and bake process of a polymer, such as a spin-on dielectric (SOD).

In an embodiment of the present invention, the lower layer 100 includes a low-density dielectric material. In an embodiment of the present invention, the lower layer 100 includes SiCH. In an embodiment of the present invention, the lower layer 100 includes SiCNH.

In an embodiment of the present invention, the lower layer 100 is very thin. In an embodiment of the present invention, the lower layer 100 includes a thickness of 0.6-1.0 nanometer (nm). In an embodiment of the present invention, the lower layer 100 includes a thickness of 1.0-1.7 nm. In an embodiment of the present invention, the lower layer 100 includes a thickness of 1.7-2.8 nm.

In an embodiment of the present invention, the lower layer 100 is discontinuous. An areal density or coverage of 1.00 is equivalent to complete coverage. In an embodiment of the present invention, the lower layer 100 is discontinuous and includes a coverage of 0.50-0.65. In an embodiment of the present invention, the lower layer 100 is discontinuous and includes a coverage of 0.65-0.80. In an embodiment of the present invention, the lower layer 100 is discontinuous and includes a coverage of 0.80-0.95.

In an embodiment of the present invention, the lower layer 100 is non-uniform in thickness. A thickness of zero is a result of non-nucleation for a vacuum process or of dewet for a liquid process. In an embodiment of the present invention, the lower layer 100 includes a variable thickness of 0-3.0 nm over the substrate 90 and the device 95. In an embodiment of the present invention, the lower layer 100 includes a variable thickness of 0-6.0 nm over the substrate 90 and the device 95. In an embodiment of the present invention, the lower layer 100 includes a variable thickness of 0-9.0 nm over the substrate 90 and the device 95.

In an embodiment of the present invention, the lower layer 100 is porous. In an embodiment of the present invention, the pores are closed (completely internal), interconnected (between pores), or open (to an external surface). Total porosity is a pore fraction by volume and varies from zero (solid with no pores) to one (cavity with no materials). In an embodiment of the present invention, the lower layer 100 includes a total porosity of 0.15-0.30. In an embodiment of the present invention, the lower layer 100 includes a total porosity of 0.30-0.45. In an embodiment of the present invention, the lower layer 100 includes a total porosity of 0.45-0.60.

In an embodiment of the present invention, the lower layer 100 is formed to be thicker when it is porous. In an embodiment of the present invention, the lower layer 100 is porous and formed to be twice as thick as when it is non-porous. In an embodiment of the present invention, the lower layer 100 is porous and includes a thickness of 1.2-2.0 nm. In an embodiment of the present invention, the lower layer 100 is porous and includes a thickness of 2.0-3.4 nm. In an embodiment of the present invention, the lower layer 100 is porous and includes a thickness of 3.4-5.6 nm.

Figure 1B:
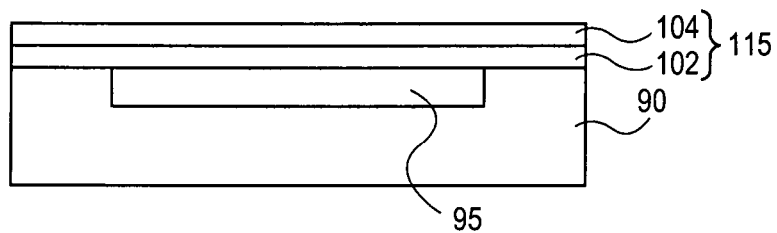

In an embodiment of the present invention, the lower layer 100 is exposed to a pretreatment. Pretreatment of the lower layer 100 refers to a treatment that precedes formation of an overlying layer, such as an upper layer 104. In an embodiment of the present invention, the pretreatment converts the lower layer 100 as shown in FIG. 1A into a modified lower layer 102 as shown in FIG. 1B. In an embodiment of the present invention, the modified lower layer 102 is denser than the lower layer 100. In an embodiment of the present invention, the modified lower layer 102 is thinner than the lower layer 100.

In an embodiment of the present invention, the pretreatment conditions the lower layer 100. In an embodiment of the present invention, the pretreatment modifies a top (outer) surface of the lower layer 100. In an embodiment of the present invention, the pretreatment modifies a bulk (interior) of the lower layer 100.

In an embodiment of the present invention, the lower layer 100 is exposed to a liquid phase or wet pretreatment, such as cross-linking with a chemical solution.

In an embodiment of the present invention, the lower layer 100 is exposed to a gas phase pretreatment, such as oxidizing underlying metal with oxygen. In an embodiment of the present invention, the lower layer 100 is exposed to a gas phase pretreatment, such as reducing underlying oxides with hydrogen.

In an embodiment of the present invention, the lower layer 100 is exposed to a photonic pretreatment, such as cross-linking with ultraviolet light, In an embodiment of the present invention, the lower layer 100 is exposed to a photonic pretreatment, such as heating with infrared light.

In an embodiment of the present invention, the lower layer 100 is exposed to an electron-beam (e-beam) pretreatment, such as cross-linking with electrons. In an embodiment of the present invention, the lower layer 100 is exposed to an electron-beam (e-beam) pretreatment, such as breaking bonds with electrons.

In an embodiment of the present invention, the lower layer 100 is exposed to a plasma pretreatment 101 as shown in FIG. 1A. In an embodiment of the present invention, the plasma pretreatment 101 includes a high-density plasma pretreatment. In an embodiment of the present invention, the plasma pretreatment 101 includes plasma pretreatment with $NH_3$. In an embodiment of the present invention, the plasma pretreatment 101 includes plasma pretreatment with $H_2$. In an embodiment of the present invention, the plasma pretreatment 101 includes plasma pretreatment with He.

In an embodiment of the present invention, the plasma pretreatment 101 removes corrosion inhibitors left by chemical mechanical polish (CMP). In an embodiment of the present invention, the plasma pretreatment 101 removes hydrocarbons. In an embodiment of the present invention, the plasma pretreatment 101 removes organics.

In an embodiment of the present invention, the plasma pretreatment 101 removes existing contamination. In an embodiment of the present invention, the plasma pretreatment 101 incorporates existing contamination. In an embodiment of the present invention, the plasma pretreatment 101 immobilizes existing contamination.

In an embodiment of the present invention, the plasma pretreatment 101 improves adhesion.

In an embodiment of the present invention, the plasma pretreatment 101 causes chemical densification. In an embodiment of the present invention, the plasma pretreatment 101 removes carbon ($CH_x$) from a top (outer) surface of the lower layer 100. In an embodiment of the present invention, the plasma pretreatment 101 causes physical densification. In an embodiment of the present invention, the plasma pretreatment 101 increases density.

In an embodiment of the present invention, the plasma pretreatment 101 increases a dielectric constant (k). In an embodiment of the present invention, the lower layer 100 has an effective k value of 2.5-5.2. In an embodiment of the present invention, the modified lower layer 102 has an effective k value of 3.4-6.1. In an embodiment of the present invention, the upper layer 104 has an effective k value of 4.3-7.0.

Then, as shown in an embodiment of the present invention in FIG. 1B, an upper layer 104 is formed over either the lower layer 100 or the modified lower layer 102.

In an embodiment of the present invention, the lower layer 100 is not exposed to a pretreatment, and, thus, not converted to a modified lower layer 102 before formation of the upper layer 104. In an embodiment of the present invention, the lower layer 100 (and not the modified lower layer 102) is combined with the upper layer 104 to form the dielectric separator layer 115.

In an embodiment of the present invention, the lower layer 100 is exposed to a pretreatment, and, thus, converted to a modified lower layer 102 before formation of the upper layer 104. In an embodiment of the present invention, the modified lower layer 102 is combined with the upper layer 104 to form the dielectric separator layer 115.

In an embodiment of the present invention, the upper layer 104 includes a high-density dielectric material. In an embodiment of the present invention, the upper layer 104 includes SiCNH. In an embodiment of the present invention, the upper layer 104 includes SiNH. In an embodiment of the present invention, the upper layer 104 includes SiOC. The SiOC that may be used in the upper layer 104 is denser than the SiOC that may be used in the interlevel dielectric layer 110. In an embodiment of the present invention, the upper layer 104 includes SiCBN. In an embodiment of the present invention, the upper layer 104 includes AlN. In an embodiment of the present invention, the upper layer 104 includes BN. In an embodiment of the present invention, the upper layer 104 includes C.

In an embodiment of the present invention, the upper layer 104 is thicker than the modified lower layer 102. In an embodiment of the present invention, the upper layer 104 includes a thickness of 5-8 nm. In an embodiment of the present invention, the upper layer 104 includes a thickness of 8-15 nm. In an embodiment of the present invention, the upper layer 104 includes a thickness of 15-25 nm.

In an embodiment of the present invention, the dielectric separator layer 115 is not a bilayer and does not include an upper layer 104. In an embodiment of the present invention, the lower layer 100 by itself (without an upper layer 104) forms the dielectric separator layer 115.

In an embodiment of the present invention, the dielectric separator layer 115 is not a bilayer and does not include an upper layer 104. In an embodiment of the present invention, the modified lower layer 102 by itself (without an upper layer 104) forms the dielectric separator layer 115 (after pretreatment).

In an embodiment of the present invention, the dielectric separator layer 115 is not a bilayer and does not include either a lower layer 100 or a modified lower layer 102. In an embodiment of the present invention, the upper layer 104 by itself forms the dielectric separator layer 115.

In an embodiment of the present invention, the dielectric separator layer 115 is not a bilayer and is formed from merging together a lower layer 100 and an upper layer 104 into a single layer.

In an embodiment of the present invention, the dielectric separator layer 115 is not a bilayer and is formed from merging together a modified lower layer 102 and an upper layer 104 into a single layer.

Next, an interlayer dielectric (ILD) layer 110 is formed over the upper layer 104 of the dielectric separator layer 115. The k value of the ILD layer 110 is minimized to prevent excessive intralayer and interlayer capacitance which contributes to cross-talk and increases resistance-capacitance (RC) product delay of an inlaid interconnect 175 to be formed later, as shown in an embodiment of the present invention in FIG. 1I. An increase in RC product delay will degrade switching speed of the device 95 in the substrate 90 that is connected to the inlaid interconnect 175.

A dielectric material is considered to be low-k if its k value is lower than the k value of undoped $SiO_2$ which is about 3.9-4.5. In an embodiment of the present invention, the ILD layer 110 includes doped oxides such as PSG and BPSG. Doping $SiO_2$ with Fluorine to form Fluorinated Silicate Glass (FSG or SiOF) reduces k value to about 3.5-4.0. Other low-k materials having even lower k value may be formed from certain organic materials or silicate materials. Low-k materials may also be formed from hybrids of organic and silicate materials, such as organosilicate glass (OSG) or Carbon-doped Oxide (CDO or SiOC). In an embodiment of the present invention, the ILD layer 110 includes other materials such as CFx, and amorphous Carbon ($\alpha$—C:H).

In an embodiment of the present invention, the ILD layer 110 has a thickness selected from a range of about 100 nm for a lower level to about 500 nm for an upper level. In an embodiment of the present invention, a total of 3-6 interlevel dielectric layers may be stacked over the device 95. In an embodiment of the present invention, a total of 6-9 interlevel dielectric layers may be stacked over the device 95. In an embodiment of the present invention, a total of 9-12 interlevel dielectric layers may be stacked over the device 95.

In an embodiment of the present invention, the ILD layer 110 is formed with a coat and bake process of a polymer, such as a spin-on dielectric (SOD).

In an embodiment of the present invention, the ILD layer 110 is formed with a chemical vapor deposition (CVD) process. In the CVD process, precursor molecules in a gas phase are dissociated by an energy source to form active species, such as free radicals. The active species in the gas phase react and condense on a solid surface, such as the dielectric separator layer 115, to form the ILD layer 110.

In an embodiment of the present invention, the CVD process occurs at atmospheric pressure (about 760 Torr) or higher with an energy source that may include a combustion flame source, such as an oxyacetylene torch source or a plasma torch source. The plasma torch source includes a Direct Current (DC) plasma arc jet source.

In an embodiment of the present invention, the CVD process occurs at atmospheric pressure (about 760 Torr) or lower with an energy source that includes a thermal source, such as a hot filament (HF) source. The HF source includes a single filament or multiple filaments.

In an embodiment of the present invention, the CVD process occurs at atmospheric pressure (about 760 Torr) or lower with an energy source that includes an electron or ion bombardment source, such as an electrical discharge source or a plasma source.

In an embodiment of the present invention, the ILD layer 110 is formed with a plasma-enhanced CVD (PECVD) process. The plasma source includes a radio frequency (RF) plasma source, a microwave (MW) plasma source, an electron cyclotron resonance (ECR) plasma source, a Direct Current (DC) plasma source, or a laser plasma source.

In an embodiment of the present invention, the RF plasma source is generated by radiation with a frequency of about 13.56 MegaHertz (MHz). In another embodiment of the present invention, the RF plasma source includes an inductively-coupled plasma (ICP) source.

In an embodiment of the present invention, a negative substrate bias of about 40-800 volts DC is used with the RF plasma source. In another embodiment of the present invention, a negative substrate bias of about 800-3,500 volts DC is used with the RF plasma source. The substrate bias is a function of the RF plasma power and the pressure in the reactor. The substrate bias also depends on the geometry and the dimensions of the reactor. In an embodiment of the present invention, the reactor, or deposition tool, includes parallel plates.

In an embodiment of the present invention, the MW plasma is generated by radiation with a frequency of about 2.45 GigaHertz (GHz). In another embodiment of the present invention, the MW plasma is generated by radiation with a frequency of about 915 MHz.

In an embodiment of the present invention, the laser plasma is generated by radiation with an ultraviolet (UV) wavelength from an excimer laser with multiple pulses.

The process is selected to produce desired structure and properties for the ILD layer 110. The process parameters for deposition of the ILD layer 110 include source gas flow rate, substrate temperature, reactor pressure, and plasma power (or plasma power density).

In an embodiment of the present invention, the deposition of the ILD layer 110 includes a source gas flow rate of about 50-200 standard cubic centimeters per minute (SCCM). In another embodiment of the present invention, the source gas flow rate is about 200-800 SCCM. In still another embodiment of the present invention, the source gas flow rate is varied as a function of time.

In an embodiment of the present invention, the deposition of the ILD layer 110 includes a substrate temperature of about 175-250 degrees Centigrade. In another embodiment of the present invention, the deposition of the ILD layer 110 includes a substrate temperature of about 250-400 degrees Centigrade. In still another embodiment of the present invention, the deposition of the ILD layer 110 includes a substrate temperature of about 400-625 degrees Centigrade.

In an embodiment of the present invention, the deposition of the ILD layer 110 includes a reactor pressure of about 0.001-20 Torr. In another embodiment of the present invention, the deposition of the ILD layer 110 includes a reactor pressure of about 20-250 Torr. In still another embodiment of the present invention, the deposition of the ILD layer 110 includes a reactor pressure of about 250-760 Torr. In yet another embodiment of the present invention, the deposition of the ILD layer 110 includes a reactor pressure of about 760 Torr or higher.

In an embodiment of the present invention, the deposition of the ILD layer 110 includes a plasma power of about 1-10 kiloWatts (kW). In another embodiment of the present invention, the plasma power is about 10-100 kW. In an embodiment of the present invention, the plasma power is pulsed on and off as a function of time. In another embodiment of the present invention, the plasma power is varied as a function of time.

In an embodiment of the present invention, the plasma power density is about 0.1-0.5 Watts per square centimeter ($W/cm^2$). In another embodiment of the present invention, the plasma power density is about 0.5-2.5 $W/cm^2$.

The deposition rate depends upon the process parameters. In an embodiment of the present invention, the deposition rate for the ILD layer 110 is about 0.5-4.0 nm/minute. In another embodiment of the present invention, the deposition rate for the ILD layer 110 is about 4.0-30.0 nm/minute. In still another embodiment of the present invention, the deposition rate for the ILD layer 110 is about 30.0-250.0 nm/minute.

In an embodiment of the present invention, the ILD layer 110 is modified by creating pores in-situ. In an embodiment of the present invention, the pores 112 are introduced to reduce the effective k value of the ILD layer 110 without excessively degrading the mechanical strength of the ILD layer 110.

In an embodiment of the present invention, the pores 112 are filled with a material, such as a gas, with a low k value. In an embodiment of the present invention, the gas includes air with a k value of about 1.0. In another embodiment of the present invention, the gas includes hydrogen. In another embodiment of the present invention, the gas includes nitrogen.

The effective k value of the ILD layer 110 depends upon the nominal k value of the bulk material forming the ILD layer 110 and the nominal k value of the material, if present, filling the pores 112, weighted by the total porosity of the ILD layer 110. The effective k value for the ILD layer 110 is reduced as the design rules for the device 95 are decreased.

In an embodiment of the present invention, the ILD layer 110 has an effective k of 1.25-1.75. In an embodiment of the present invention, the ILD layer 110 has an effective k of 1.75-2.25. In an embodiment of the present invention, the ILD layer 110 has an effective k of 2.25-2.75. The k value is determined by measuring capacitance on a parallel-plate electrical structure.

The mechanical strength of the ILD layer 110 depends upon several factors, such as the total porosity, the local porosity, the pore 112 size (such as, the equivalent diameter), and the pore 112 size distribution across the ILD layer 110. The mechanical strength of the ILD layer 110 also depends upon the density of the ILD layer 110.

Total porosity is the pore fraction by volume and varies from zero to one. In an embodiment of the present invention, the total porosity of the ILD layer 110 is selected from a range of about 0.15-0.30. In another embodiment of the present invention, the total porosity of the ILD layer 110 is selected from a range of about 0.30-0.45. In still another embodiment of the present invention, the total porosity of the ILD layer 110 is selected from a range of about 0.45-0.60. In yet another embodiment of the present invention, the total porosity of the ILD layer 110 is selected from a range of about 0.60-0.75.

In an embodiment of the present invention, a high total porosity, such as about 0.60-0.75, reduces mechanical strength and barrier layer 106 coverage. In another embodiment of the present invention, a high total porosity, such as about 0.60-0.75, increases surface roughness and line-edge roughness (LER).

The local porosity of the ILD layer 110 varies for a given total porosity. In an embodiment of the present invention, the local porosity varies by location (x-position and y-position) within the plane of the ILD layer 110. In another embodiment of the present invention, the local porosity varies as a function of depth (z-position) in the ILD layer 110.

The pores 112 in the ILD layer 110 are closed, interconnected, or open. The closed pores include voids with internal surfaces that are spread around a nominal center. In an embodiment of the present invention, closed pores are small with an equivalent diameter that is selected from a range of about 2-6 nm. In another embodiment of the present invention, closed pores are medium with an equivalent diameter that is selected from a range of about 6-18 nm. In still another embodiment of the present invention, closed pores are large with an equivalent diameter that is selected from a range of about 18-55 nm.

The interconnected pores include two or more closed pores that have merged together. In an embodiment of the present invention, the pores start transitioning from closed pores to interconnected pores at a total porosity of about 0.30 or higher. In another embodiment of the present invention, the pores start transitioning from closed pores to interconnected pores at a total porosity of about 0.45 or higher.

The open pores include pores that have intersected external surfaces of the ILD layer 110. Open pores trap contaminants, especially those that are liquid or gaseous. The contaminants affect function, operation, performance, or reliability of the device 95.

The open pores also reduce the surface area for adhesion at an interface between the ILD layer 110 and an underlying or overlying layer. The reduced surface area decrease interfacial bonding strength and result in delamination or cracking, especially when a mismatch in coefficient of thermal expansion (CTE) exists among the materials in the vicinity of the interface.

In an embodiment of the present invention, the CTE is about 1-3 parts per million per degree Kelvin (ppm/K) for the ILD layer 110, about 2-7 ppm/K for the substrate 90 and the dielectric separator layer 115, and about 12-23 ppm/K for the conductor layer 170. In another embodiment of the present invention, the CTE of the ILD layer 110 is matched closely with the CTE for the substrate 90 and the dielectric separator layer 115.

In an embodiment of the present invention, the mechanical strength of the interlevel dielectric layer 110 is improved with a posttreatment. In an embodiment of the present invention, the posttreatment of the interlevel dielectric layer 110 includes an electron beam (e-beam) cure. In an embodiment of the present invention, the posttreatment of the interlevel dielectric layer 110 includes an ultraviolet (UV) cure.

Young's modulus of elasticity is a measurement of the mechanical strength of a material. In an embodiment of the present invention, the ILD layer 110 has a Young's modulus of elasticity of 0.8-2.0 GPa. In an embodiment of the present invention, the ILD layer 110 has a Young's modulus of elasticity of 2.0-4.0 GPa. In an embodiment of the present invention, the ILD layer 110 has a Young's modulus of elasticity of 4.0-6.0 GPa.

Shear strength is another measurement of the mechanical strength of a material. The shear strength of the ILD layer 110 is sufficient to withstand the CMP process that may be used to planarize the conductor layer 170, as shown in an embodiment in FIG. 1H. In an embodiment of the present invention, the ILD layer 110 has a shear strength of 0.3-2.4 GPa.

Fracture toughness is yet another measurement of the mechanical strength of a material. In an embodiment of the present invention, the ILD layer 110 has a fracture toughness of 0.1-0.5 $MPa\text{-}m^{0.5}$ for mode I (tensile stress) crack opening. In an embodiment of the present invention, the ILD layer 110 has a fracture toughness of 0.5-2.0 $MPa\text{-}m^{0.5}$ for mode I (tensile stress) crack opening. In an embodiment of the present invention, the ILD layer 110 has a fracture toughness of 2.0-6.00 $MPa\text{-}m^{0.5}$ for mode I (tensile stress) crack opening.

An embodiment of a variation of a via-first process flow for a dual Damascene scheme will be described next. However, different embodiments of the present invention are compatible with other process flows, such as a variation of a trench-first process flow for a dual Damascene scheme.

Figure 1C:
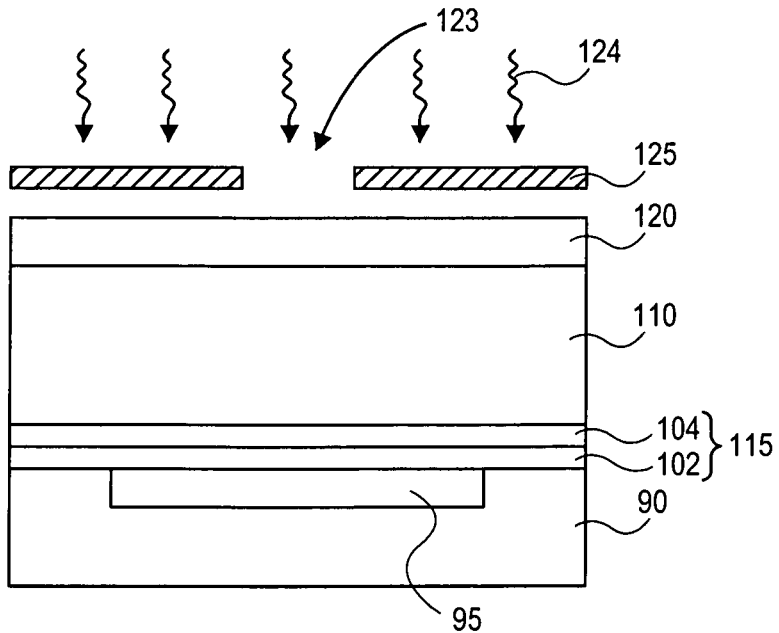
Figure 1D:
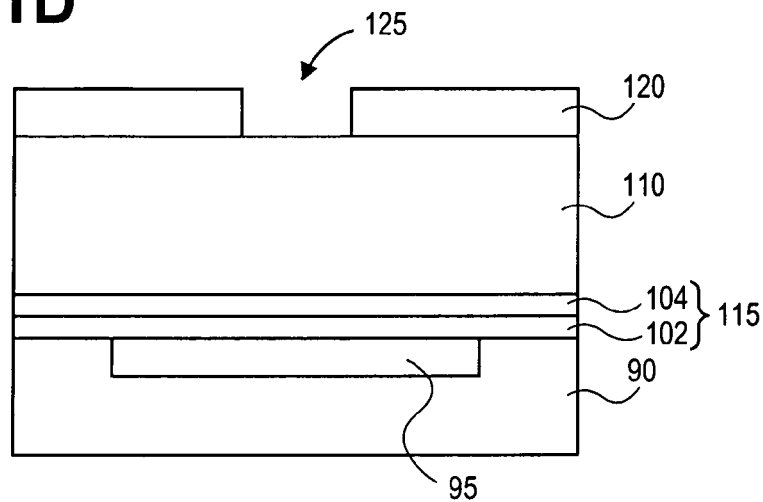
Figure 1E:
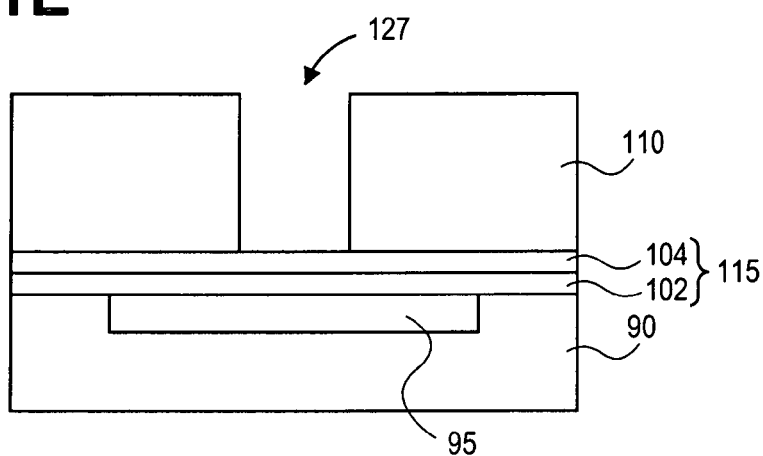

After formation of the ILD layer 110, the processes of photolithography and etch are used to pattern a via 127, as shown in an embodiment of the present inevntion in FIGS. 1C-1E.

In an embodiment of the present invention as shown in FIG. 1C, a radiation-sensitive material, such as a via-layer photoresist 120, is applied over the ILD layer 110. Then, a portion of the via-layer photoresist 120 is exposed to radiation 124 of an appropriate wavelength and dose. The exposure is performed in an imaging tool, such as a wafer stepper or a wafer scanner. A via-layer reticle 125 with a via opening 123 is placed in the optical path of the radiation 124 to determine a corresponding portion of the via-layer photoresist 120 that is to be exposed.

In an embodiment of the present invention as shown in FIG. 1D, exposure is followed by development of the via-layer photoresist 120 to create a via-layer mask. The via-layer mask includes a via feature 125 in FIG. 1D that corresponds to the exposed portion of the via-layer photoresist 120 in FIG. 1C. The shape and critical dimension (CD) of the via feature 125 in the via-layer photoresist 120 is derived from a design of the via opening 123 on the via-layer reticle 125. In an embodiment of the present invention, the photoresist 120 has a thickness of about 75 nm and the via feature 125 may have a CD of about 45 nm.

The via feature 125 patterned in the via-layer photoresist 120 in FIG. 1D is transferred into the ILD layer 110 by a dry etch process, as shown in an embodiment of the present invention in FIG. 1E. The etch rate of the ILD layer 110 is selected from a range of about 150-1,200 nm/minute. The formation of the via 127 involve precleans and postcleans associated with the dry etch.

The dry etch process, such as a plasma etch process or a reactive ion etch process (RIE), is used to etch the via 127 completely through the ILD layer 110. The upper layer 104 of the dielectric separator layer 115 under the ILD layer 110 serves as an etch stop to allow a longer over-etch to clean out the bottom of the via 127 without breaking through and damaging the underlying device 95 in the substrate 90.

High directionality is desired for the via 127 etch when the narrowest portion of the via 127 has a large aspect ratio (depth:width), such as about 6:1 or greater. In one embodiment, a high density plasma, such as an RF ICP, is used.

The dry etch of the ILD layer 110 to form the via 127 is performed with a gas mixture. The gas mixture for etching the ILD layer 110 formed from an inorganic material may include an etching gas, such as $CF_4$, and a polymerizing gas, such as $CH_2F_2$. Other gases that may be used for via 127 etch include $CHF_3$ and $C_3F_6$ as well as $NF_3$. The etching gas serves as a principal source of Fluorine for etching the ILD layer 110 while the polymerizing gas improves selectivity by passivating the sidewalls of the via 127 during the etch.

The etch selectivity of the ILD layer 110 to the via-layer photoresist 120 is higher than about 20:1. If the etch selectivity is not sufficiently large, additional processing complexity is required, such as including a hard mask (not shown) that will not be eroded during dry etch of the ILD layer 110.

After via 127 etch, the via-layer photoresist 120 is removed. If desired, the via 127 etch and the strip of the via-layer photoresist 120 are performed sequentially in an integrated tool.

Figure 1F:
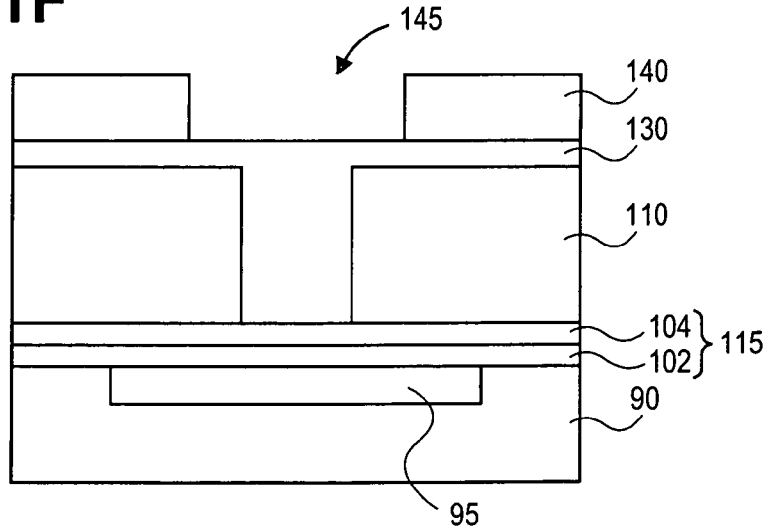
Figure 1G:
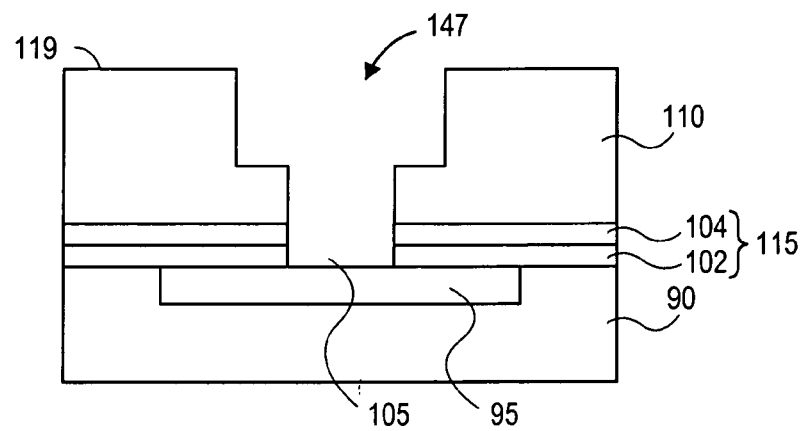

After formation of the via 127, the processes of photolithography and etch are used to pattern a trench 147, as shown in an embodiment of the present invention in FIGS. 1F-1G.

A bottom anti-reflective coating (BARC) 130 is formed over the ILD layer 110 and in the via 127, as shown in an embodiment of the present invention in FIG. 1F. Then, a trench-layer photoresist 140 is applied over the BARC 130. The BARC 130 minimizes any exposure problem in the vicinity of the via 127 that is caused by swing-curve effects from the thickness variation in the trench-layer photoresist 140 by light-scattering effects from the step-height change in the ILD layer 110. The BARC 130 also minimizes further etch of the via 127 during the subsequent etch of the trench.

Then, the trench-layer photoresist 140 is exposed using radiation (not shown) of the appropriate wavelength and dose. The exposure is performed in an imaging tool, such as a wafer stepper or a wafer scanner, and modulated by a trench-layer reticle (not shown). Exposure is followed by development of a trench feature 145 in the trench-layer photoresist 140.

The trench feature 145 in the trench-layer photoresist 140 is superimposed over the via 127 etched into the ILD layer 110. The shape and CD of the trench feature 145 is derived from a design on the trench-layer reticle (not shown). In an embodiment of the present invention, the BARC 130 has a thickness of about 25 nm, the photoresist 140 has a thickness of about 75 nm, and the trench feature 145 has a CD of about 45 nm.

A dry etch process, such as a plasma etch process or an RIE process, is used to partially etch the ILD layer 110 to form a trench 147 over the via 127, as shown in an embodiment in FIG. 1G. High directionality is desired for the trench etch when the narrowest portion of the trench-via opening 147 has a large aspect ratio (depth:width), such as about 6:1 or greater. In one embodiment, a high-density plasma, such as an RF ICP, is used for the trench etch.

The dry etch of the ILD layer 110 to form the combined trench-via opening 147 is performed with a gas mixture. The dry etch of the ILD 110 to form the via 127 may be performed with a gas mixture. The gas mixture for etching an ILD 110 formed from an inorganic material may include an etching gas, such as $CF_4$, and a polymerizing gas, such as $CH_2F_2$. The etching gas serves as a principal source of Fluorine for etching the ILD 110 while the polymerizing gas improves selectivity by passivating the sidewalls of the via 127 during the etch. The etch selectivity of the ILD 110 to the via-layer photoresist 120 may be higher than about 20:1. Other gases that may be used for via 127 etch include $CHF_3$ and $C_3F_6$ as well as $NF_3$. The etch rate of the ILD 110 may be selected from a range of about 150-1,200 nm/minute.

The etch selectivity of the ILD layer 110 to the trench-layer photoresist 140 is higher than about 3:1. If the etch selectivity is not sufficiently large, additional processing complexity is required, such as including a hard mask (not shown) that will not be eroded during dry etch of the ILD layer 110.

After etching the trench-via opening 147 in the ILD layer 110, the trench-layer photoresist 140 and the underlying BARC 130 are removed. If desired, the trench etch and the strip of the trench-layer photoresist 140 and the BARC 130 are performed sequentially in an integrated tool.

Then, a portion 105 of the dielectric separator layer 115 underlying the trench-via opening 147, as shown in an embodiment in FIG. 1G, is removed, such as by a dry etch. The underlying conductor 95 is not damaged by the removal of the portion 105 of the dielectric separator layer 115 below the trench-via opening 147.

Figure 1H:
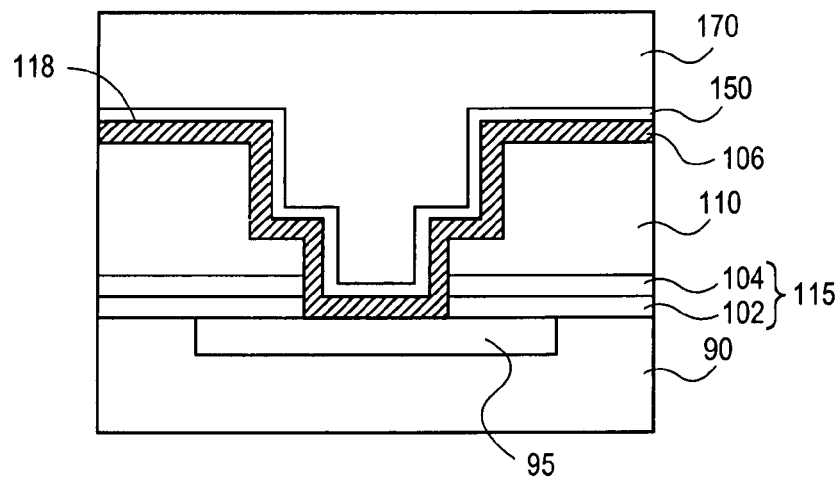

As shown in an embodiment of the present invention in FIGS. 1G-1H, a barrier layer 106 is formed in the trench-via opening 147 and over an upper surface 119 of the ILD layer 110. Copper is used for the conductor layer 170 to be formed later in the trench-via opening 147. Copper has a high diffusivity so the barrier layer 106 must encapsulate the sides and the bottom of the trench-via opening 147 to prevent diffusion of Copper into the ILD layer 110 and the underlying device 95. Otherwise, Copper introduces mid-gap states into the substrate 90 and degrades carrier lifetime.

The barrier layer 106 is formed from a metal, including a refractive metal, such as Tantalum (Ta), or an alloy, such as Titanium-Tungsten (TiW), or a ceramic, such as Tantalum-Nitride (TaN), Tantalum-Silicon-Nitride (TaSiN), Titanium-Nitride (TiN), or Tungsten-Nitride (WN). In an embodiment of the present invention, the barrier layer 106 has a thickness selected from a range of about 5-20 nm.

In an embodiment of the present invention, the barrier layer 106 includes a lower layer of TaN to adhere to the underlying ILD layer 110 and an upper layer of Ta to adhere to the overlying seed layer 150. The barrier layer 106 formed from a Ta/TaN bilayer has a total thickness selected from a range of about 8-15 nm.

High directionality is desired for forming the barrier layer 106, especially when the narrowest portion of the trench-via opening 147 has a large aspect ratio (depth:width), such as about 6:1 or greater. The technique of ionized physical vapor deposition (I-PVD) is used to form a material with better step coverage than other techniques, such as collimation sputtering or long-throw sputtering (LTS).

In certain cases, a MOCVD process is used to form the barrier layer 106. Alternatively, the barrier layer 106 is formed using atomic-layer deposition (ALD), especially for a thickness of about 10 nm or less. ALD provides good step coverage and good thickness uniformity even while permitting the use of a low deposition temperature, such as of about 200-400 degrees Centigrade.

When the trench-via opening 147 is to be filled later by electroplating a conductor layer 170, a seed layer 150 should first be formed over the barrier layer 106, as shown in an embodiment in FIG. 1H. In order to serve as a base for electroplating, the seed layer 150 must be electrically conductive and continuous over the barrier layer 106. Adhesion loss of the seed layer 150 from the underlying barrier layer 106 is prevented. Interfacial reaction of the seed layer 150 with the underlying barrier layer 106 is also prevented.

The seed layer 150 is formed from the same or different material as the conductor layer 170 to be formed later. For example, the seed layer 150 includes a metal, such as Copper, or an alloy. The seed layer 150 has a thickness selected from a range of about 10-20 nm.

The seed layer 150 is deposited by I-PVD, especially when the conductor layer 170 is to be formed later by electroplating. If desired, the dielectric separator layer 115 and the seed layer 150 is sequentially deposited in a tool, without breaking vacuum, so as to prevent formation of an undesirable interfacial layer between the seed layer 150 and the underlying barrier layer 106.

When the conductor layer 170 is to be subsequently formed by PVD, better material properties and surface characteristics are achieved for the conductor layer 170 if the seed layer 150 is formed using CVD. The seed layer 150 is also formed with ALD or electroless plating.

Figure 1I:
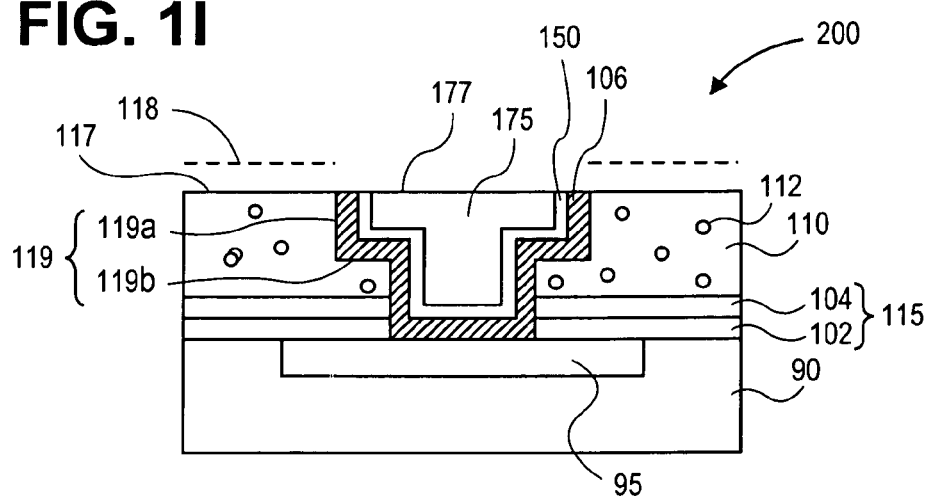

Next, the trench-via opening 147 is filled with a conductor layer 170 to make electrical contact with the underlying device 95, as shown in an embodiment in FIG. 1I. The conductor layer 170, such as a metal, is formed over the seed layer 150 by an electrochemical process, such as electroplating or electrofilling. The conductor layer 170 has a thickness that provides an overburden of about 300 nm above the ILD layer 110.

In other embodiments, the conductor layer 170 is formed with a PVD process or a CVD process. A PVD process or a CVD process is particularly advantageous when forming the conductor layer 170 over a trench-via opening 147 that has a large aspect ratio (depth:width), such as about 6:1 or greater. A PVD process usually has a lower Cost-of-Ownership (CoO) than a CVD process. In some cases, a MOCVD process is also used.

The conductor layer 170 is treated after being formed to modify its material properties or surface characteristics. The treatment includes a rapid thermal anneal (RTA) process after deposition to modify or stabilize grain size. For example, Copper that has been formed by electroplating has a grain size of about 50-10,000 nm, depending upon the thickness, deposition conditions, and anneal conditions. A larger grain size usually corresponds to a lower resistivity which is more desirable. For example, Copper has a resistivity of about 1.7-2.5 micro-ohm-centimeter (uohm-cm) at 20 degrees Centigrade.

A as shown in an embodiment in FIG. 1I, a chemical-mechanical polishing (CMP) process is used to remove the overburden of the conductor layer 170 and the portion of the barrier layer 106 over an upper surface 117 of the ILD layer 110. The CMP process to create an inlaid interconnect 175 in the trench-via opening 147 is optimized depending upon the polish rates of different materials. Polish selectivity to different materials is optimized by changing the properties of the polish pad, the properties of the polish slurry, and the parameters of the polish tool.

The process of CMP combines abrasion and dissolution to flatten and smoothen surface relief. Abrasion occurs when higher portions of the surface contact a pad and abrasive particles in a slurry and become subject to mechanical forces. Dissolution occurs when materials at the surface contact chemicals in the slurry and become subject to chemical or electrochemical reactions.

In one embodiment, the slurry includes an abrasive and a complexing agent. The abrasive may include particles, such as Alumina ($Al_2O_3$) or Silica ($SiO_2$), while the complexing agent includes a chemical, such as Ammonium Hydroxide ($NH_4OH$) or Potassium Hydroxide (KOH). A relatively soft pad is used to prevent the generation of defects. A final buff is used to remove scratches.

In a first embodiment, the CMP process involves three polishes. The first polish removes most of the overburden of the conductor layer 170. The second polish planarizes the remaining conductor layer 170 (and the seed layer 150) over an upper surface 118 of the barrier layer 106. The polish rate of the conductor layer 170 in the first polish and the second polish may be selected from a range of about 90-1,300 nm/minute. The third polish removes the barrier layer 106 over an upper surface 117 of the ILD layer 110.

In a second embodiment, the CMP process involves two polishes. The first polish removes all of the overburden of the conductor layer 170 and planarizes the remaining conductor layer 170 (and the seed layer 150) over the upper surface 118 of the barrier layer 106. The second polish removes the barrier layer 106 over the upper surface 117 of the ILD layer 110.

In a third embodiment, the CMP process involves one polish to remove all of the overburden of the conductor layer 170, the remaining conductor layer 170 (and the seed layer 150), as well as, remove the barrier layer 106 over the upper surface 117 of the ILD layer 110.

The CMP process, regardless of whichever embodiment is used, should not cause the ILD layer 110 to fracture or delaminate due to excessive stress. After the CMP process, an upper surface 177 of the inlaid interconnect 175 is flat and level with the upper surface 117 of the ILD layer 110 as shown in an embodiment of the present invention in FIG. 1I.

After planarization with CMP, another dielectric separator layer 115 (not shown) is formed over the upper surface 177 of the inlaid interconnect 175 and the upper surface 117 of the ILD layer 110. In an embodiment of the present invention, the dielectric separator layer 115 also serves as a capping layer to prevent diffusion, intermixing, or reaction of the inlaid interconnect 175 with the surrounding materials.

A process sequence analogous to the embodiment shown in FIG. 1A-1I is repeated to form the next higher layer of inlaid interconnect. In a dual Damascene scheme, each layer includes a via and an overlying trench.

The total number of layers of interconnect depend on whether the device 95 is a memory device, which has fewer (backend interconnect) layers, or a logic device, which has more (backend interconnect) layers.

In an embodiment of the present invention, a total of 3-6 interlevel dielectric layers may be stacked over the device 95. In an embodiment of the present invention, a total of 6-9 interlevel dielectric layers may be stacked over the device 95. In an embodiment of the present invention, a total of 9-12 interlevel dielectric layers may be stacked over the device 95.

The total number of layers of interconnect also depend on the design rules for the device 95. In an embodiment of the present invention, a total of 9-12 layers is formed for a logic device with 45-nm design rules.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, and so forth, described herein. It is to be understood that the detailed description of the present invention should be taken as illustrative and not limiting, wherein the scope of the present invention should be determined by the claims that follow.

Thus, we have described a method of forming an electrically insulating material with low dielectric constant and good mechanical strength and a structure including a dielectric having low dielectric constant and good mechanical strength.

I claim:
1. A method comprising:
providing an inlaid interconnect in an interlevel dielectric layer, said inlaid interconnect comprising a via and an overlying trench;
forming a lower layer over said inlaid interconnect and said interlevel dielectric, the lower layer comprising SiCH or SiCNH;
densifying said lower layer to convert said lower layer to a modified lower layer with a k value of between 3.4 and 6.1;

forming an upper layer over said modified lower layer, the upper layer comprising SiCNH or SiNH and being at least five times as thick as the lower layer and having a k value between 4.3 and 7.0;

forming a second interlevel dielectric layer on the upper layer, the second interlevel dielectric layer having a thickness at least twenty times as thick as the upper layer and having a k value less than 2.75;

etching the second interlevel dielectric layer to form a via opening, the upper layer acting as an etch stop layer for the etch; and filling the via opening with a barrier layer and conductor layer, the barrier layer extending from at least the top of the second interlevel dielectric layer to at least the lower layer.

2. The method of claim 1 further comprising coating and baking a spin-in dielectric to form said interlevel dielectric layer.

3. The method of claim 1 wherein said interlevel dielectric layer is formed with plasma enhanced chemical vapor deposition (PECVD) comprising:

a substrate temperature of about 250-400 degrees Centigrade; and a reactor pressure of about 20-250 Torr.

4. The method of claim 1 wherein said densifying of said lower layer comprises a plasma pretreatment.

5. The method of claim 4 wherein said plasma pretreatment removes Carbon from a top surface of said lower layer.

* * * * *